United States Patent [19]

Luther et al.

[11] Patent Number: 4,544,438

[45] Date of Patent: Oct. 1, 1985

[54] LIQUID PHASE EPITAXIAL GROWTH OF BISMUTH-CONTAINING GARNET FILMS

[75] Inventors: Lars C. Luther, Basking Ridge; Virendra V. S. Rana, Berkeley Heights, both of N.J.

[73] Assignee: AT&T Bell Laboratories, Murray Hill, N.J.

[21] Appl. No.: 615,836

[22] Filed: May 31, 1984

[51] Int. Cl.$^4$ .............................................. C30B 19/04
[52] U.S. Cl. ........................... 156/624; 156/DIG. 63; 156/DIG. 79; 252/62.57; 252/364; 427/128
[58] Field of Search ....... 156/621, 622, 624, DIG. 63, 156/DIG. 64, DIG. 67, DIG. 74, DIG. 79; 252/364, 62.57; 423/263; 427/128; 428/900

[56] References Cited

U.S. PATENT DOCUMENTS

| | | | |
|---|---|---|---|
| 3,790,405 | 2/1974 | Levinstein | 156/624 |
| 4,077,832 | 5/1978 | Robertson et al. | 156/DIG. 63 X |
| 4,092,208 | 5/1978 | Brice et al. | 156/624 |
| 4,295,988 | 10/1981 | Nelson et al. | 156/624 X |
| 4,400,445 | 8/1983 | Berkstresser et al. | 156/DIG. 63 X |
| 4,419,417 | 12/1983 | Le Craw et al. | 156/610 X |

FOREIGN PATENT DOCUMENTS

| | | | |
|---|---|---|---|
| 7025758 | 3/1972 | France | 252/62.57 |
| 56-160330 | 12/1981 | Japan | 427/128 |

OTHER PUBLICATIONS

Breed et al.; Garnet Films for Micron and Submicron Magnetic Bubbles with Low Damping Constants, Appl. Phys., vol. 24, No. 2, Feb. 1981, pp. 163–167.

Wanklyn et al.; Flux Growth of Rare Earth Silicates and Aluminosilicates; J. of Material Science, vol. 9, No. 12, Dec. 1974, pp. 2007–2014.

Primary Examiner—Hiram H. Bernstein
Assistant Examiner—Michael S. Gzybowski
Attorney, Agent, or Firm—Peter A. Businger

[57] ABSTRACT

Epitaxial layers of bismuth containing magnetic garnet materials are grown from a melt which comprises flux components lead oxide, bismuth oxide, and one or several additional oxides selected from vanadium oxide, tungsten oxide, and molybdenum oxide. The presence of such additional flux component results in increased magnetic anisotropy per degree of supercooling and thus enhances device properties and facilitates epitaxial layer deposition.

5 Claims, 3 Drawing Figures

LIQUID PHASE EPITAXIAL GROWTH OF BISMUTH-CONTAINING GARNET FILMS

The Government has rights in this invention pursuant to Contract F33615-81-C-1404 awarded by the Department of the Air Force.

FIELD OF THE INVENTION

The invention is concerned with liquid phase epitaxial growth of garnet films as may be used, e.g., in the manufacture of magnetic bubble devices.

BACKGROUND OF THE INVENTION

The development of magnetic bubble devices has reached the stage of commercial use, particularly for the storage of sequentially retrievable data in communications and data processing equipment.

Magnetic bubble devices typically comprise a flat, nonmagnetic substrate of a material such as, e.g., gadolinium-gallium garnet, nominally $Gd_3Ga_5O_{12}$, and a layer of a magnetic garnet material which is epitaxially deposited on the substrate and whose easy direction of magnetization is perpendicular to the layer. In the presence of a suitable magnetic bias field parallel to such direction, the layer is capable of sustaining small domains, called bubbles, which are magnetized in a direction opposite to the direction of the bias field. Desirable domains typically have right circular cylindrical shape and extend from near the surface of the magnetic film to the vicinity of the film-substrate interface. Bubble diameter may be approximately equal to the thickness of the film.

Device operation typically involves the nucleation, propagation, and detection of magnetic bubbles, propagation being along paths or tracks which may be defined, e.g., by magnetic overlays, by a pattern of locally modified magnetic properties in the layer, or by a conductor overlay as disclosed, e.g., in the paper by A. H. Bobeck et al., "Current-Access Magnetic Bubble Circuits," *Bell System Technical Journal*, Vol. 58, No. 6, July-August 1979, pp. 1453-1540.

Preferred for the deposition of magnetic garnet layers on a substrate is a method of liquid phase epitaxy, involving controlled growth from garnet constituents in flux solution as disclosed in, e.g., U.S. Pat. No. 3,790,405, issued Feb. 5, 1974 to H. J. Levinstein. Properties of resulting layers such as, e.g., thickness, defect density, magnetization, coercivity, anisotropy field, and bubble diameter, stability, and mobility are dependent on growth conditions such as, e.g., melt composition, growth temperature, and growth procedure as discussed, e.g., in papers by S. L. Blank et al., "Kinetics of LPE Growth and its Influence on Magnetic Properties", *AIP Conference Proceedings*, Vol. 10 (1974), pp. 255-270;

S. L. Blank et al., "Preparation and Properties of Magnetic Garnet Films Containing Divalent and Tetravalent Ions", *Journal of the Electrochemical Society*, Vol. 123, No. 6, June 1976, pp. 856-863; and S. L. Blank et al., "The Effect of Melt Composition on the Curie Temperature and Flux Spin-Off from Lutetium Containing LPE Garnet Films", *IEEE Transactions on Magnetics*, Vol. MAG-13, No. 5, September 1977, pp. 1095-1097.

As magnetic device technology progresses towards increasingly higher bit densities, layer specifications change; in particular, specified layer thickness decreases as shown, e.g., in the paper by S. L. Blank et al., "Design and Development of Single Layer, Ion-Implantable Small Bubble Materials for Magnetic Bubble Devices", *Journal of Applied Physics*, 50, March 1979, pp. 2155-2160.

Recent interest has been directed to epitaxial growth from melts comprising a $PbO-V_2O_5$ flux component as disclosed in U.S. Pat. No. 4,400,445, issued Aug. 23, 1983 to G. W. Berkstresser et al.; also, as disclosed in U.S. Pat. No. 4,419,417, issued Dec. 6, 1983 to R. C. LeCraw et al., the inclusion of bismuth in magnetic garnet film has been found beneficial.

SUMMARY OF THE INVENTION

Magnetic bubble devices comprising a bismuth-containing garnet layer or film are manufactured by a method which comprises epitaxial growth of such layer on a substrate. Growth is in a melt comprising flux and garnet constituents; according to the invention, the flux preferably comprises lead oxide, excess bismuth oxide, and an additional flux component selected from vanadium oxide, tungsten oxide, and molybdenum oxide. In accordance with the invention, presence of the additional flux component results in greater magnetic anisotropy per degree of supercooling of the melt.

Preferred limits on the amount of the additional oxide are 1 to 20 molecular percent, the former being motivated by the realization of an appreciable effect on degree of supersaturation and the latter by melt stability considerations. More preferred limits are 3 or preferably 5 to 15 molecular percent in these respects. (Limits are on amounts of $V_2O_5$, $WO_3$, and $MoO_3$; it is understood, however, that at elevated temperatures such oxides may undergo partial dissociation.) Preferred limits are 50 to 98 molecular percent for PbO and 1 to 30 molecular percent for $Bi_2O_3$.

DETAILED DESCRIPTION

Garnets suitable for magnetic device application are typically patterned after the prototype, yttrium-iron garnet, $Y_3Fe_5O_{12}$, which, in its unaltered form, is ferrimagnetic with net magnetic moment of approximately 1750 gauss at room temperature. For the manufacture of magnetic bubble devices having an extended range of operating temperatures, compositions of the more general form $R_{3-x}Bi_xFe_5O_{12}$ have been recommended, where R denotes a rare earth element of the lanthanide series (atomic number 57 to 71) or a combination of two or more such elements.

Magnetic moment may be modified by partial substitution of Fe ions, e.g., by Ga ions, resulting in a material having nominal composition according to the formula $R_3Fe_{5-x}Ga_xO_{12}$, where x denotes a positive number less than 5 and preferably less than 2. Iron substitution may also be by replacement of Fe ions with Ge or Si ions or both, in which case there is a need for valence balancing, e.g., by replacement of a portion of rare earth ions by suitable divalent or monovalent ions. For example, replacement of rare earth ions by the divalent ion Ca results in compositions which may be formulated as $R_{3-x-y}Bi_xCa_yFe_{5-v-w}Si_vGe_wO_{12}$, where y is approximately equal to v+w.

While magnetic bubble devices are typically based on the use of rare earth-iron magnetic garnet materials, layers of other garnets such as, e.g., gadolinium-gallium garnet and gadolinium-aluminum garnet may also be produced according to the invention. What is required in each instance is a substrate whose lattice parameters at least approximately match those of the layer to be grown. Resulting grown layers may exhibit magnetic anisotropy, as may be growth- or strain-induced. Easy direction of magnetization may be perpendicular to a substrate as, e.g., in bubble layers. Layers having easy direction parallel to the substrate may be deposited for hard bubble suppression.

Figure 1:
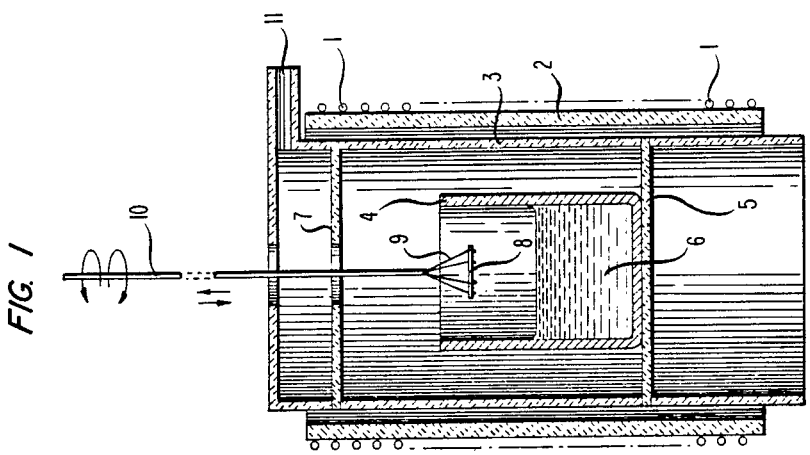
FIG. 1 is a schematic view of apparatus as may be used for liquid phase epitaxy growth of magnetic garnet films according to the invention.

Apparatus suitable for magnetic garnet epitaxial deposition according to the invention is schematically depicted in FIG. 1. In particular, FIG. 1 shows heating element 1 on ceramic support tube 2 surrounding ceramic liner tube 3. Crucible 4 is supported by baffle 5 and contains melt 6 comprising garnet and flux materials. Baffle 7 acts as a radiation shield for preventing excessive cooling of the surface of melt 6. Substrate 8 is attached to substrate holder 9 which is attached to rod 10.

Operation of apparatus involves heating the melt first at elevated temperature for homogenization and equilibration, and then at a temperature corresponding to supercooling of garnet material, lowering rod 10 until substrate 8 is immersed in or at least in contact with the surface of melt 6, and, typically, rotating rod 10. An exhaust pump may be connected at 11.

Figure 2:
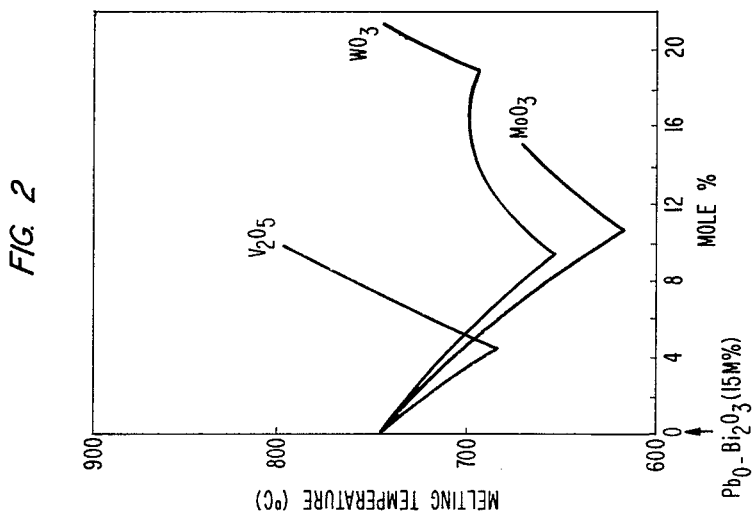
FIG. 2 is a graphical representation of melting temperature as a function of the amount of $V_2O_5$, $WO_3$, or $MoO_3$ added to a representative $PbO-Bi_2O_3$ flux.

FIG. 2 shows melting temperature of a flux made from 15 mole percent $Bi_2O_3$, 0 to 22 mole percent $V_2O_5$, $WO_3$, or $MoO_3$, and remainder PbO. It can be seen that melting temperture is highly nonlinear and that such temperature assumes a local minimum for each of the three flux constituents $V_2O_5$, $WO_3$, and $MoO_3$.

Figure 3:
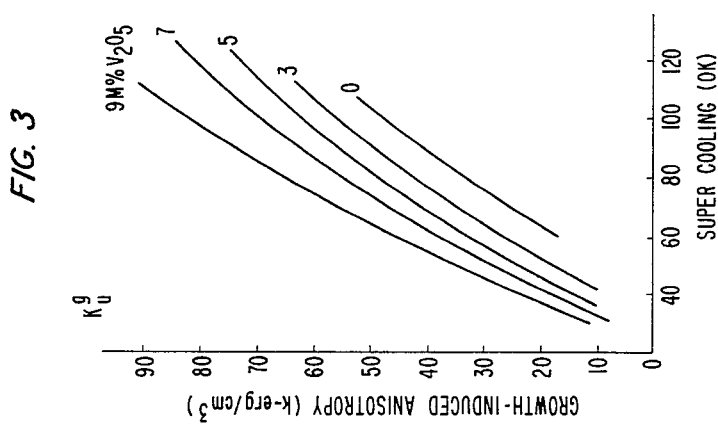
FIG. 3 is a graphical representation of magnetic anisotropy in a representative layer grown in accordance with the invention as a function of amount of supercooling, each curve corresponding to a different amount of $V_2O_5$ added to the melt.

FIG. 3 shows growth-induced magnetic anisotropy in units of $10^3$ erg/cm$^3$ as a function of supercooling in units of degrees K. It can be seen that growth-induced magnetic anisotropy is directly related to supercooling as well as to the amount of $V_2O_5$ present in the flux. This fact is useful in that, in accordance with the invention, greater growth-induced anisotropy is produced per degree of supercooling when the flux additive $V_2O_5$ is used. Essentially similar results are obtained using $WO_3$ or $MoO_3$ instead of $V_2O_5$.

In accordance with the invention a desired level of growth-induced magnetic anisotropy can be achieved at reduced supercooling as is desirable in the interest of ease of layer deposition. For example, devices having a period of approximately 8 micrometers preferably have a magnetic anisotropy which is approximately 32,000 erg/cm$^3$. As can be seen from FIG. 3, growth from a flux consisting essentially of lead oxide and bismuth oxide is at approximately 80 degrees C. supercooling. On the other hand, when the flux comprises 9 mole percent vanadium oxide, supercooling is reduced to 50 degrees C.

Magnetic bubble devices are made, using layers produced according to the invention, by providing means for nucleating, propagating, and detecting magnetic bubbles in a magnetic layer. Such means may take a variety of forms as reviewed, e.g., in the paper by A. H. Bobeck et al. cited above.

As illustrated by the following examples, garnet films were deposited by liquid phase epitaxy on circular $Gd_3Ga_5O_{12}$ substrates having a diameter of 5 cm. Cleaning of substrates before layer growth was as follows: 20 minutes in an ultrasonic bath of 1 gm Alconox in 100 milliliter water at 50 degrees C., rinsing in warm water, 15 minutes in an ultrasonic bath of water at 50 degrees C., and rinsing in three-stage overflow deionized water for 5 minutes per stage. After growth, cleaning was as follows: 10 minutes in a solution of 6 volumes $H_2O$, 3 volumes $HNO_3$, and 1 volume $CH_3COOH$ at 75 degrees C., rinsing in warm water, and repeating steps of pregrowth cleaning.

Substrates were rotated at 75 revolutions per minute in an oscillating mode during epitaxial deposition.

EXAMPLE 1

A melt was prepared by melting approximately 3.59 grams $Y_2O_3$, 2.40 grams CaO, 9.34 grams $SiO_2$, 15.31 grams $GeO_2$, 168.0 grams $Fe_2O_3$, 222.0 grams $MoO_3$, 2294 grams PbO, and 413.0 grams $Bi_2O_3$ in a platinum crucible. $Bi_2O_3$ was added last, and after the other ingredients had been melted and mixed. The melt was heated by resistance-heating coils to a temperature of approximately 1000 degrees C. The melt was allowed to react at this temperature for a period of approximately 16 hours.

The saturation temperature of this melt was determined as the lowest melt temperature for which no epitaxial growth was observed on a piece of polished gadolinium gallium garnet dipped into the melt for 2 minutes. For this melt a saturation temperature of 890 degrees C. was determined in this fashion.

A circular gadolinium-gallium garnet substrate approximately 2.0 inches in diameter and 20 mils in thickness was used as a deposition substrate. The substrate was cleaned, dried, and inserted in a substrate holder.

The temperature of the melt was then lowered to a growth temperature of approximately 792 degrees C. and the substrate was lowered to within 1 centimeter of the melt surface. The substrate was maintained in this position for approximately 6 minutes. The substrate was then immersed approximately 2 centimeters deep into the melt and rotated, the sense of rotation being reversed every second. Immersion was for a duration of approximately 6 minutes, and the substrate was then removed from the melt to a position 1 centimeter above the melt while rotation continued.

The rotation was stopped and the melt was allowed to drip off the substrate. This drainage process took approximately 8 minutes and was followed by a burst of fast rotation to remove melt droplets still remaining on the substrate wafer. The substrate was withdrawn at a rate of 13 cm/min.

By standard measurement techniques the following physical properties were determined for the deposited layer: A layer thickness of approximately 2.21 micrometers, a magnetic domain stripe width of approximately 1.66 micrometer, a saturation magnetization (commonly designated as 4 $\pi M_s$) of approximately 716 gauss, an anisotropy field (commonly designated as $H_k$) of approximately 2590 gauss, a material length parameter (commonly designated as 1) of approximately 0.16 micrometer, a lattice constant (commonly designated as $a_o$) of approximately 12.4050 Angstroms, and a uniaxial anisotropy (commonly designated as $K_u$) of approximately 95,200 erg/cm$^3$ (after strain correction).

The composition of the layer was determined as represented approximately by the formula $(Y_{1.74}Bi_{0.66}Ca_{0.60})(Fe_{4.46}Si_{0.30}Ge_{0.30})O_{12}$.

EXAMPLE 2

The procedure described in Example 1 above was followed except that the melt consisted of approximately 8.70 grams $Y_2O_3$, 1.35 grams $Gd_2O_3$, 2.35 grams $Ho_2O_3$, 6.75 grams CaO, 27.0 grams $SiO_2$, 16.0 grams $GeO_2$, 428.0 grams $Fe_2O_3$, 364.0 grams $V_2O_5$, 5880 grams PbO, and 1312 grams $Bi_2O_3$. Saturation temperature was approximately 890 degrees C., growth temperature was approximately 805 degrees C., and determined material parameters were as follows: a layer thickness of 2.00 micrometers, a stripe width of 1.63 micrometers, a saturation magnetization of 620 gauss, an anisotropy field of 1700 gauss, a material length of 0.16 micrometers, a lattice parameter of 12.384 Angstroms, and a uniaxial anisotropy of 41,900 erg/cm$^3$.

Composition of the grown film is approximately as represented by the formula $(Y_{1.43}Gd_{0.14}Ho_{0.23}Bi_{0.50}Ca_{0.70})(Fe_{4.30}Si_{0.52}Ge_{0.18})O_{12}$.

EXAMPLE 3

The procedure described in Example 1 above was followed except that the melt consisted of approximately 1.61 gram $Y_2O_3$, 1.55 gram CaO, 4.50 grams $GeO_2$, 4.20 grams $SiO_2$, 85.2 grams $Fe_2O_3$, 73.0 grams $WO_3$, 134.0 grams $Bi_2O_3$, and 740.0 grams PbO. Saturation temperature was approximately 920 degrees C., growth temperature was approximately 841 degrees C., and determined film properties were as follows: a layer thickness of 1.75 micrometer, a stripe width of 1.55 micrometer, a collapse field of 374 gauss, a saturation magnetization of 671 gauss, a lattice parameter of 12.384 Angstroms, and a uniaxial anisotropy of 51,500 erg/cm$^3$.

Composition of the grown film is approximately as represented by the formula $(Y_{1.91}Bi_{0.44}Ca_{0.65})(Fe_{4.35}Ge_{0.23}Si_{0.42})O_{12}$.

What is claimed is:

1. Method for making a magnetic bubble device comprising a layer of garnet material which contains bismuth and which is epitaxially deposited on a surface of a supporting substrate, said method comprising heating a preferred melt consisting essentially of a garnet material which contains bismuth and a flux material at a temperature corresponding to supercooling of said garnet material, said flux material comprising lead oxide and bismuth oxide, and at least one additional flux-constituent oxide selected from the group consisting of vanadium oxide, tungsten oxide, and molybdenum oxide, the lead oxide being comprised in said flux material in an amount corresponding to an amount of PbO in the range of from 50 to 98 molecular percent, the bismuth oxide being comprised in said flux material in an amount corresponding to an amount of $Bi_2O_3$ in the range of from 1 to 30 molecular percent, said additional oxide being comprised in said flux material in an amount corresponding to an amount of $V_2O_5$, $WO_3$, or $MoO_3$ in the range of from 1 to 20 molecular percent, bringing at least a surface of a substrate in contact with said melt, and removing said substrate from contact with said melt upon deposition of a layer of said garnet material on said surface, the degree of supercooling being chosen in combination with amount of said additional flux-constituent oxide so as to substantially achieve a desired level of magnetic anisotropy in said layer.

2. Method of claim 1 in which said additional oxide is comprised in said flux material in an amount corresponding to an amount of $V_2O_5$, $WO_3$, or $MoO_3$ in the range of from 3 to 15 molecular percent.

3. Method of claim 1 in which said additional oxide is vanadium oxide.

4. Method of claim 1 in which said additional oxide is tungsten oxide.

5. Method of claim 1 in which said additional oxide is molybdenum oxide.

* * * * *